(12) United States Patent
McCord

(10) Patent No.: US 8,263,952 B1
(45) Date of Patent: Sep. 11, 2012

(54) LEAD FREE BARIUM SULFATE ELECTRICAL INSULATOR AND METHOD OF MANUFACTURE

(76) Inventor: Stuart J. McCord, Westford, MA (US)

( * ) Notice: Subject to any disclaimer, the term of this patent is extended or adjusted under 35 U.S.C. 154(b) by 164 days.

(21) Appl. No.: 12/820,521

(22) Filed: Jun. 22, 2010

(51) Int. Cl.
*H01J 37/301* (2006.01)

(52) U.S. Cl. ............... 250/492.21; 250/423 R; 174/650; 524/423

(58) Field of Classification Search ............. 250/492.21, 250/424, 425, 426, 427; 174/650; 524/423
See application file for complete search history.

(56) References Cited

U.S. PATENT DOCUMENTS

| | | |
|---|---|---|
| 2,118,413 A | 5/1938 | Mesick, Jr. et al. |
| 3,328,338 A | 6/1967 | Parish |
| 3,473,028 A | 10/1969 | Curry |
| 4,157,476 A | 6/1979 | O'Connor |
| 4,485,838 A | 12/1984 | Shoji et al. |
| 4,619,963 A | 10/1986 | Shoji et al. |
| 4,938,233 A | 7/1990 | Orrison |
| 4,957,943 A | 9/1990 | McAllister |
| 5,190,990 A | 3/1993 | Eichmiller |
| 5,360,666 A | 11/1994 | Eichmiller |
| 5,443,775 A | 8/1995 | Brannon |
| 5,548,125 A | 8/1996 | Sandbank |
| 5,665,808 A | 9/1997 | Bilsbury |
| 5,719,352 A | 2/1998 | Griffin |
| 5,730,664 A | 3/1998 | Asakura |
| 6,048,379 A | 4/2000 | Bray et al. |
| 6,166,390 A | 12/2000 | Quapp et al. |
| 6,310,355 B1 | 10/2001 | Cadwalader |
| 6,487,273 B1 | 11/2002 | Takenaka et al. |
| 6,548,570 B1 | 4/2003 | Lange |
| 6,644,853 B1 | 11/2003 | Kantor et al. |
| 6,674,838 B1 | 1/2004 | Barrett |
| 6,722,665 B1 | 4/2004 | Burkhart et al. |
| 6,740,260 B2 | 5/2004 | McCord |
| 7,079,624 B1 | 7/2006 | Miller et al. |
| 7,638,783 B2 * | 12/2009 | McCord ...................... 250/515.1 |
| 2005/0258404 A1 * | 11/2005 | McCord ......................... 252/582 |
| 2007/0145294 A1 * | 6/2007 | McCord ..................... 250/474.1 |
| 2009/0198007 A1 * | 8/2009 | Wang ............................ 524/423 |
| 2010/0044599 A1 * | 2/2010 | McCord ..................... 250/515.1 |
| 2010/0072662 A1 * | 3/2010 | Wang ............................ 264/241 |

\* cited by examiner

*Primary Examiner* — Jack Berman
(74) *Attorney, Agent, or Firm* — Marian J. Furst

(57) ABSTRACT

A high voltage insulator and radiation shield made of barium sulfate composite comprising a polymer matrix and at least about 20 percent barium sulfate therein. The device may be made by casting. By means of use of various combinations of barium sulfate, other radiologically resistant materials, polymers, and third components, the physical, radiological and electrical properties of the finished products may be tailored to achieve desired properties. In addition, the invention teaches that radiation shielding, insulators, and combined radiation shield/insulators may be fashioned from the composite. A wide range of production methods may be employed, including but not limited to liquid resin casting.

8 Claims, 2 Drawing Sheets

LEAD FREE BARIUM SULFATE ELECTRICAL INSULATOR AND METHOD OF MANUFACTURE

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR 1.71(d).

FIELD OF THE INVENTION

This invention relates to generally to X-ray and ion beam electrical insulators and particularly to polymer-metal-precursor composite insulators in which the metal-precursor component is barium sulfate.

BACKGROUND OF THE INVENTION

X-ray and gamma ray sources are presently being used in a wide array of medical and industrial machinery, and the breadth of such use expands from year to year. Consumers tend to notice medical and dental X-ray machines, but in addition to these applications there are baggage screening machines, CAT scan machines, non-destructive industrial inspection machinery and ion implantation machines used in the manufacture of silicon wafer computer chips. All require that high voltage generated within the device be contained, and furthermore that radiation be contained and directed. In particular, the ion implantation machinery increased in the 1980's and 1990's with the silicon chip boom.

In the past, lead itself or lead-polymer composites were used to make electrical insulator items. But there are numerous problems with the use of lead. One problem with lead is that it is toxic and thus subject to increasingly stringent legal controls. Another issue is that lead may not have the mechanical or electrical properties desired for a given application. Lead has been used in various forms in wide range of applications: machined, as a solid-casting, as a solid encased within a matrix such as a polymer matrix, or as a filler. As a filler, it may be lead particles, tribasic lead-sulfate or lead-oxide particles or particles of a specified shape or size, or as a mixture with other materials such as tin. Tungsten shielding, or polymer-tungsten shielding has also been used. Examples of all of these methods may be found in the prior art.

In general, polymer-metal composites are materials having a polymer matrix containing particles of a metal compound intermixed therein. The polymer may advantageously have plastic properties allowing for ease of manufacture, but a wide variety of polymers are known for use in such composites. In the prior art, lead has been a particularly favored material for its density and ease of working. Tungsten has been favored more recently, despite cost concerns. Three characteristics in particular which make such materials desirable are electrical non-conductivity, radiological shielding ability, and high density.

There is a growing list of applications for which polymer-metal composite materials are either required or advantageous. Ion implantation machine source insulators, X-ray tube insulation, radioisotope housings, and other castings and housings could benefit from the properties of polymer-metal composite materials. In the case of typical high voltage insulators for ion implantation machinery, a thick walled generally round or cylindrical part is created out of lead or polymer-lead-oxide ranging from an inch to several feet or more in long dimension and weighing anywhere up to 500 pounds. Wall thickness may range from ½ inch to several inches. Such parts must resist high voltages, shield against x-ray or gamma ray emission and hold a high vacuum state when connected to the vacuum chamber. High voltage X-ray shielding for X-ray tube insulators is generally thinner (often 0.070 inch thickness), generally smaller, and of different shape, having an aperture for the X-ray beam, but once again must offer high voltage insulation and radiation protection. The lead in such devices obviously presents an environmental challenge to manufacture, use, and disposal.

In the processing of lead precursor filled plastics known in the art, specialized facilities, handling procedures, training, and safety equipment must be used to protect the employees from the lead precursor they handle. Lead-based dust is a particular concern, being airborne and inhalable. Such dust may be generated during mixing, molding, deflashing, machining, and finishing of final products such as insulators or shields, to say nothing of earlier stages of mining, smelting, and refining of lead and the final disposal of the used product at the end of its useful life. Even during the life span of the product, it is illegal to sand, machine, alter or use the product in any way that will generate dust. All such processes must be carried out at special lead handling sites, and all waste dust from any of these processes must be collected in accordance with OSHA regulations and transported to hazardous waste land fills in accordance with OSHA and DES guidelines.

Various radio-opaque agents are known which are used for diverse applications. Importantly, however, certain families of compounds are disfavored as having many of the same issues as lead and lead oxides. For example, the barium family of compounds are almost without exception subject to regulation due to their toxic nature. Other than the Applicant's previously issued U.S. Pat. No. 7,638,783 B2, issued on Dec. 29, 2009, entitled, "Lead Free Barium Sulfate Electrical Insulator and Method of Manufacture," which is incorporate herein by reference in its entirety, it is not previously known to use such barium family compounds in amounts greater than 10% by volume, since the structures in which they are emplaced are radio-opaque, not radiation barriers.

Internalized by law into the manufacturing process, such safety issues dramatically increase the cost of such products, which in turn increases other medical or industrial costs.

Various metals might be explored for lead replacement. In such cases, it is natural enough to skip metals having families which are generally considered toxic or too expensive, and to skip those generally used in radio-opaque applications rather than radiological blocking applications. Thus, it would be natural to skip the barium family of compounds, since these are highly regulated.

It would be preferable to explore the use of other materials which are non-toxic and thus considerably safer than lead or certain available alternatives.

SUMMARY OF THE INVENTION

General Summary

The present invention teaches a novel lead-free plastic material that may act as a replacement for lead or lead oxide filled plastics, particularly in the role of electrical insulators in radiation devices. The present invention teaches a polymer-barium sulfate composite comprising a plastic matrix having barium sulfate materials within it as "filler" at a percentage of at least twenty percent of the total volume. The properties of barium sulfate are favorable and unexpected for a number of reasons. The use as an electrical insulator and materials for rigid radiation shields is unexpected due to the fact that most other members of the family are toxic and thus subject to environmental regulation, thus reducing or eliminating the key reason for lead replacement in any case. It is further unexpected in that barium sulfate is normally used in "radio-opaque" applications such as medical X-ray procedures, and it not normally considered a suitable material for actual higher density electrical insulators of radiation shielding and similar applications.

The new material allows a wider range of function and use when compared with previous methods using a single metal, lead, or a lead and polymer composite.

The present invention further teaches the use of binders, fibers, and secondary fillers in the polymer-barium sulfate composite in order to further broaden the range of achievable desirable physical, radiological and/or electrical properties.

The present invention importantly teaches casting of the device as a process of manufacture.

SUMMARY IN REFERENCE TO CLAIMS

It is a first aspect, advantage, objective and embodiment of the invention to provide an electrical insulator for an ion source, the insulator comprising:
a generally annular body having a diameter of at least 6 inches; the body having at least one vacuum sealing surface dimensioned and configured to provide a tight seal;
the body made of a material comprising:
a. a polymer matrix; and
b. barium sulfate within the polymer matrix in an approximate amount of at least about 20% by volume.

It is another aspect, advantage, objective, and embodiment of the invention to provide an electrical insulator, wherein the body is made of a material comprising at least about 24% by volume barium sulfate.

It is another aspect, advantage, objective, and embodiment of the invention to provide an electrical insulator, wherein the body is made of a material comprising at least about 25% by volume barium sulfate.

It is another aspect, advantage, objective, and embodiment of the invention to provide an electrical insulator, further comprising at least one element selected from alignment pins projecting from the vacuum sealing surface of the insulator, metal inserts secured to the body, and combinations thereof.

It is another aspect, advantage, objective, and embodiment of the invention to provide an electrical insulator, further comprising a third material selected from the group consisting of electrically insulating materials, binders, high density materials, and combinations thereof.

It is another aspect, advantage, objective, and embodiment of the invention to provide an electrical insulator, wherein the third material comprises at least one member selected from the group of tungsten, lead, platinum, gold, silver, tantalum, calcium carbonate, hydrated alumina, tabular alumina, silica, glass beads, glass fibers, magnesium oxide/sulfate, wollastonite, stainless steel fibers, copper, carbonyl iron, iron, molybdenum, nickel and combinations thereof.

It is another aspect, advantage, objective, and embodiment of the invention to provide an electrical insulator, wherein the polymer matrix comprises at least one member selected from the following group: epoxy, polyester, polyurethane, silicone rubber, bismaleimides, polyimides, vinylesters, urethane hybrids, polyurea elastomer, phenolics, cyanates, cellulose, flouro-polymer, ethylene inter-polymer alloy elastomer, ethylene vinyl acetate, nylon, polyetherimide, polyester elastomer, polyester sulfone, polyphenyl amide, polypropylene, polyvinylidene flouride, acrylic, homopolymers, acetates, copolymers, acrylonitrile-butadiene-styrene, flouropolymers, ionimers, polyamides, polyamide-imides, polyacrylates, polyether ketones, polyaryl-sulfones, polybenzimidazoles, polycarbonates, polybutylene, terephthalates, polyether sulfones, thermoplastic polyimides, thermoplastic polyurethanes, polyphenylene sulfides, polyethylene, polypropylene, polysulfones, polyvinylchlorides, styrene acrylonitriles, polystyrenes, polyphenylene, ether blends, styrene maleic anhydrides, allyls, aminos, polyphenylene oxide, and combinations thereof.

It is another aspect, advantage, objective, and embodiment of the invention to provide an electrical insulator, wherein the polymer matrix comprises epoxy resin in an approximate amount of 50% to 70% by volume.

It is another aspect, advantage, objective, and embodiment of the invention to provide a high voltage insulating radiation enclosure comprising:
a first truncated cone section and a second truncated cone section;
An overlap joint securing the two truncated cone sections together at their respective bases;
an interior space defined by the two truncated cone sections;
wherein:
the first and second truncated cone sections have walls made of a material comprising:
a polymer matrix;
barium sulfate within the polymer matrix in an amount of at least about 20% by volume; and
a high density material withing the polymer matrix in an amount of at least about 15% by volume;
a first emission port passes through at least one wall; and
a second electrical port passes through at least one wall.

It is another aspect, advantage, objective, and embodiment of the invention to provide a high voltage insulating radiation enclosure, further comprising an X-ray tube disposed within the hollow body.

It is another aspect, advantage, objective, and embodiment of the invention to provide a high voltage insulating radiation enclosure, further comprising at least one oil port passing through the walls.

It is another aspect, advantage, objective, and embodiment of the invention to provide a high voltage insulating radiation enclosure, wherein the polymer matrix comprises at least one member selected from the following group: epoxy, polyester, polyurethane, silicone rubber, bismaleimides, polyimides, vinylesters, urethane hybrids, polyurea elastomer, phenolics, cyanates, cellulose, flouro-polymer, ethylene inter-polymer alloy elastomer, ethylene vinyl acetate, nylon, polyetherimide, polyester elastomer, polyester sulfone, polyphenyl amide, polypropylene, polyvinylidene flouride, acrylic, homopolymers, acetates, copolymers, acrylonitrile-butadiene-styrene, flouropolymers, ionimers, polyamides, polyamide-imides, polyacrylates, polyether ketones, polyaryl-sulfones, polybenzimidazoles, polycarbonates, polybutylene, terephthalates, polyether sulfones, thermoplastic polyimides, thermoplastic polyurethanes, polyphenylene sulfides, polyethylene, polypropylene, polysulfones, polyvinylchlorides, styrene acrylonitriles, polystyrenes, polyphenylene, ether blends, styrene maleic anhydrides, allyls, aminos, polyphenylene oxide, and combinations thereof.

It is another aspect, advantage, objective, and embodiment of the invention to provide a high voltage insulating radiation enclosure, wherein the polymer matrix comprises epoxy resin in an amount between about 50% and about 70% by volume.

It is another aspect, advantage, objective, and embodiment of the invention to provide a high voltage insulating radiation enclosure, further comprising: a fourth material.

It is another aspect, advantage, objective, and embodiment of the invention to provide a high voltage insulating radiation enclosure, wherein the fourth material comprises at least one member selected from the following group: electrically insulating materials, binders, and combinations thereof.

It is another aspect, advantage, objective, and embodiment of the invention to provide a high voltage insulating radiation enclosure, further comprising a fourth material comprising at least one member selected from the following group: tungsten, lead, platinum, gold, silver, tantalum, calcium carbonate, hydrated alumina, tabular alumina, silica, glass beads, glass fibers, magnesium oxide/sulfate, wollastonite, stainless steel fibers, copper, carbonyl iron, iron, molybdenum, nickel and combinations thereof.

BRIEF DESCRIPTION OF THE DRAWINGS

These and other features, aspects, and advantages of the present invention will become better understood with reference to the following description, appended claims, and accompanying drawings, where:

DETAILED DESCRIPTION

Figure 1:
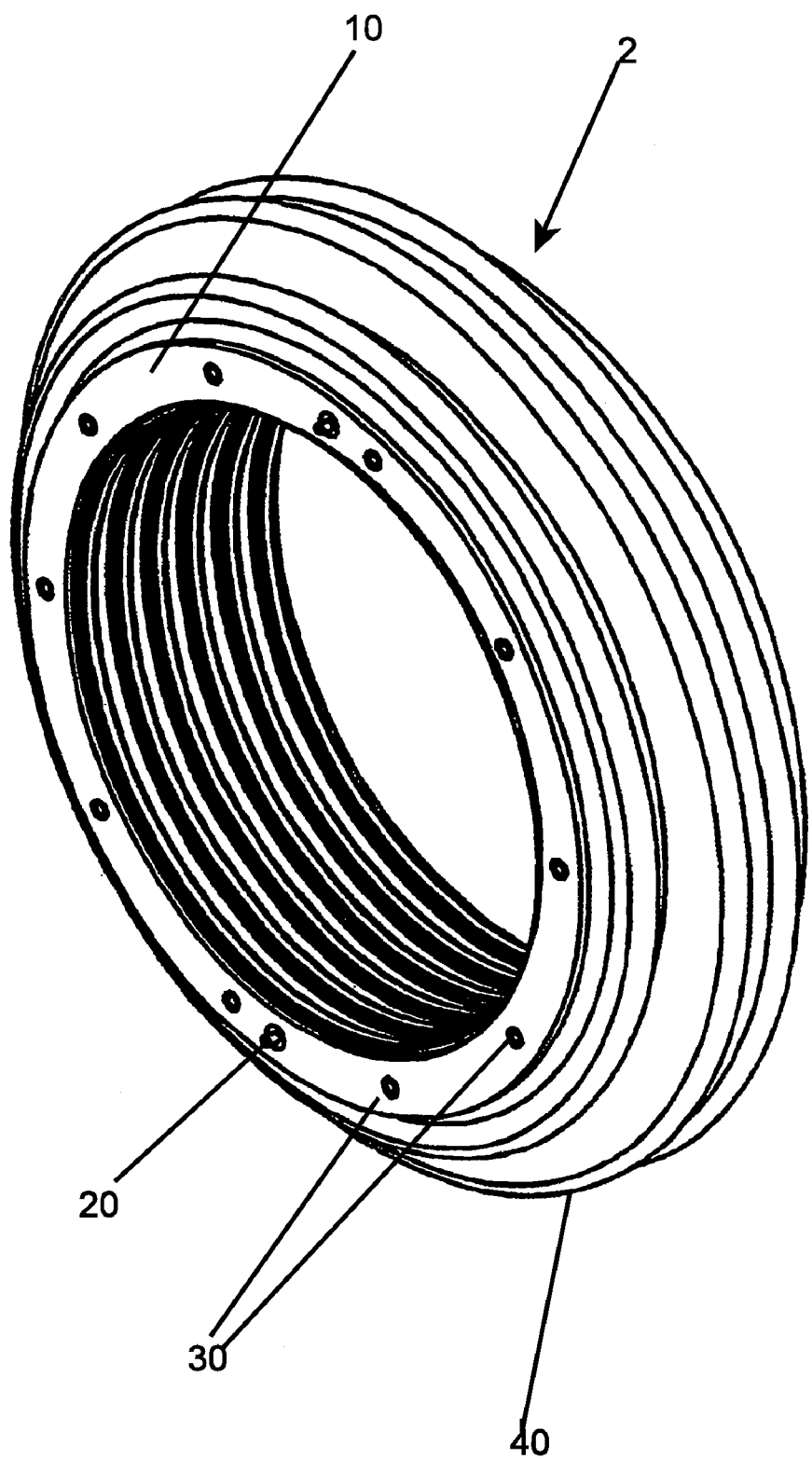
FIG. 1 is a perspective view of a first embodiment of an ion source insulator according to the present invention.

The present invention teaches novel lead-free electrical insulators of a cast plastic material that may act as replacements for lead or lead oxide filled plastics, particularly in radiation devices. The presently preferred embodiment and best mode presently contemplated of the invention teaches a high voltage electrical insulator for ion implanter machines and a high voltage insulator for X-ray tube enclosures, both made of a cast polymer-barium sulfate composite comprising a high density plastic matrix having barium sulfate materials within it as filler. After the filing of the application leading to U.S. Pat. No. 7,638,783 B2, issued on Dec. 29, 2009, entitled, "Lead Free Barium Sulfate Electrical Insulator and Method of Manufacture," disclosing and claiming electrical insulators for ion sources comprising 35% or more by volume of barium sulfate in a polymer matrix, it has been found that electrical insulators can be formed with significantly less barium sulfate along with a third heavy fill material in the polymer matrix. Electrical insulators for ion sources, comprising the newer compositions disclosed herein, are currently being tested for commercial use as substitutes for prior art lead-containing insulators. U.S. Pat. No. 7,638,783 B2 is incorporated herein by reference in its entirety.

As used herein, the term "plastic" refers to materials having compositions generally known as plastics, including polymers and copolymers, and not to the hardness, rigidity, or malleability of the finished product. Indeed, products embodying the present invention are rigid, self-supporting structures.

Barium sulfate is a white, soluble and somewhat heavy compound normally used in paper manufacture. It is also administered prior to X-ray of patients, either as a liquid or for marking of items inserted into the patient: in either case, it's radio-opaque properties are used for internal navigation and diagnosis of patient's after the relatively low radiation exposure of such patients.

By teaching the use of barium sulfate, the range of materials which may be used instead of the single metal lead is increased and thus the breadth of the properties which may be achieved is increased, another benefit of the invention. In particular, when compared to lead-composites:

a. Barium sulfate consists of a combination of the barium atom, a sulfur atom, and four oxygen atoms, having properties such as a high electrical resistance, an average atomic weight of approximately 233.4, a density of roughly 4.25-4.5 grams/centimeter cubed and thus the reasonably good radiation shielding properties that are partially dependent thereon. While it does not actually meet lead oxide in terms of radiation shielding ability, it is being used in applications previously having a lower percentage of lead oxide, for example, an application having a 14% (v/v) lead component could be replaced by a component having a 35% barium sulfate component.

b. Barium sulfate offers commercial advantages over tungsten metal and even over lead oxide. While a tungsten-composite may cost $20 per pound to manufacture, and even lead oxide is roughly $1.00/lb, barium sulfate is roughly $0.30/lb at current prices, thus offering a similar or lower price. In addition, handling and manufacturing costs may be lower due to differing environmental requirements.

c. Barium sulfate offer environmental advantages over lead composites. While lead causes adverse consequences after ingestion, barium sulfate does not. While lead is subject to very stringent regulations as laid out in the BACKGROUND OF THE INVENTION, barium sulfate is not.

d. Barium sulfate is a desirable choice in lead replacement applications, due to the fact that barium sulfate is the only commonly available form of barium which is not itself an environmental hazard. Thus, replacing lead in a metal-composite application with barium carbonates, nitrates, oxides, etc, would appear to be pointless in terms of avoiding hazardous material regulations, as these substances are subject to such regulation. Barium sulfate itself is relatively harmless, even being used for the infamous "barium milkshake" given to patients suffering ulcers or other gastrointestinal disorders. The barium liquid coats the interior of the GI tract and thus provides contrast during an X-ray examination of the patient.

The present invention may be manufactured by casting with thermosetting materials and/or thermoplastic materials. In general, higher filler loadings may be advantageously employed.

The polymers, plastics, and resins which may be advantageously employed in the present invention are too numerous for a complete list. However, a partial and exemplary list includes epoxy, polyester, polyurethane, silicone rubber, bismaleimides, polyimides, vinylesters, urethane hybrids, polyurea elastomer, phenolics, cyanates, cellulose, flouro-polymer, ethylene inter-polymer alloy elastomer, ethylene vinyl acetate, nylon, polyetherimide, polyester elastomer, polyester sulfone, polyphenyl amide, polypropylene, polyvinylidene flouride, acrylic, homopolymers, acetates, copolymers, acrylonitrile-butadiene-styrene, flouropolymers, ionimers, polyamides, polyamide-imides, polyacrylates, polyether ketones, polyaryl-sulfones, polybenzimidazoles, polycarbonates, polybutylene, terephthalates, polyether sulfones, thermoplastic polyimides, thermoplastic polyurethanes, polyphenylene sulfides, polyethylene, polypropylene, polysulfones, polyvinylchlorides, styrene acrylonitriles, polystyrenes, polyphenylene, ether blends, styrene maleic anhydrides, allyls, aminos, and polyphenylene oxide. Numerous variations and equivalents are possible.

The invention is not limited to a single matrix component and a single barium sulfate composite. On the contrary, multiple components may be included, for example, copolymers may be used, or other mixtures of matrix elements. As another example in tailoring of the physical properties of the composition, a blend of more than one shielding compound, such as a blend of barium sulfate and tungsten, tungsten-precursor, or other high density fillers, etc. may be used.

In addition, the invention supports addition to the mixture of secondary fillers, binders, fibers and other components. As examples, additional electrically insulating materials, strengthening materials, materials to provide a uniform composition or bind other components, and/or density increasing materials may be used. A more specific list of examples includes such materials as tungsten metal, calcium carbonate, hydrated alumina, tabular alumina, silica, glass beads, glass fibers, magnesium oxide, wollastonite, stainless steel fibers, copper, carbonyl iron, steel, iron, molybdenum, and/or nickel.

In addition, the composite material of the present invention is susceptible to a wide range of processing methods both for creation of the material and creation of items incorporating the material. In addition to casting, other techniques including molding, aggregation, machining, liquid resin casting, transfer molding, injection molding, compression molding, extrusion, pultrusion, centrifugal molding, calendaring, filament winding, and other methods of handling are possible. Additionally, the composite of the invention may advantageously be worked with known equipment such as molds and machine tools, thus avoiding costs associated with re-equipping production facilities. Furthermore, since the material contains no lead, significant cost and time savings may be realized and burdensome regulations regarding lead may be properly avoided during these processes.

In theory, the material may be substituted for lead metal shielding on a basis of approximately 3.5 to 1. Thus, for typical lead oxide shielding of 0.070 inches thickness, a replacement may be manufactured at a ratio of 3.5 to 1 in thickness. In the case of liquid resin casting, this increased thickness further allows easier molding.

EXAMPLE I

RS-2295 is a high density filled, castable, lead free, insulating grade epoxy resin specifically designed for high voltage insulator applications requiring X-ray shielding. The rigid composite material comprises 27% by volume barium sulfate, 20% by volume bismuth precursor, and 53% by volume Novolac epoxy to form a rigid composite material. This material provides 20% of the x-ray shielding of lead metal and is equivalent to industry standard 30% lead oxide filled "orange" epoxy. This blended barium compound filled material is non-hazardous and can be processed, machined and disposed of as a non-hazardous material.

| Approximate Cured Properties of RS-2295 | | |
| --- | --- | --- |
| Color | GREEN | |
| X-ray Shielding Effectiveness | 20% OF LEAD | |
| Density | .128 LB/CU IN | |
| Specific Gravity | 3.54 | |
| Tensile Strength | 5,000 PSI | 3.5 Kg/mm$^2$ |
| Flexural Strength | 8,000 PSI | 5.6 Kg/mm$^2$ |
| Compression Strength | 13,000 PSI | 9.2 Kg/mm$^2$ |
| Elastic Modulus | 1.5 MSI | 1050 Kg/mm$^2$ |
| Thermal Expansion | 20 × 10$^{-6}$ IN/IN/° F. | 36 × 10$^{-6}$ cm/cm/° C. |
| Dielectric Strength | 280 V/mil | 7.8 KV/mm |
| Arc Resistance | 125 SEC. | |
| Dielectric Constant | 9.0 @ 1 KHz | |
| Dissipation Factor | | |
| Volume Resistivity @ 77° f. | 1 × 10$^{14}$ ohms/cm | |
| Water Absorption | 0.05% | |
| Heat Distortion Temperature | 300° F. | 150° C. |
| Thermal Conductivity | .009 @ 1 KHz | .8 Watt/Meter × K |

EXAMPLE II

RS-2277 is a castable, lead free insulating grade filled epoxy resin specifically designed for high voltage insulator applications requiring X-ray shielding. This material comprises 24% by volume barium sulfate and 16% by volume bismuth precursor and in an epoxy matrix. This material provides good electrical grade insulation properties, high mechanical properties, and superior arc resistance to any lead oxide filled epoxy. This material has equal x-ray shielding to a 25% lead oxide filled epoxy such as RS-2236, available from Resin Systems Corporation, 62 route 101-A, Amherst, N.H. 03031-2295. This material is non-flammable and meets UL94V-0.

| Approximate Cured Properties of RS-2277 | |
| --- | --- |
| Color | RED |
| X-ray Shielding Effectiveness | 16% OF LEAD |
| Density | .114 LB/ CU IN |
| Tensile Strength | 5,000 PSI |
| Flexural Strength | 8,000 PSI |
| Compression Strength | 15,000 PSI |
| Elastic Modulus | 1.4 MSI |
| Thermal Expansion | 20 × 10$^{-6}$ IN/IN/° F. |
| Dielectric Strength | 260 V/mil |
| Arc Resistance | 125 SEC. |
| Dielectric Constant | 8.5 @ 1 KHz |
| Dissipation Factor | .009 @ 1 KHz |
| Thermal Conductivity | .8 Watt/Meter × K |
| Heat Distortion Temperature | 220° F. |
| Outgassing (ASTM E595 - Tml) | .21% |
| Outgassing (ASTM E595 - Cvcm) | .01% |
| Outgassing (ASTM E595 - Wvr) | .11% |

In summary of the test results, it can be seen that for applications requiring high resistivity and high arc resistance, barium sulfate composites may be advantageously used to achieve the desired properties. While the two examples all utilized epoxy resin, the present invention is not so limited, neither to the specific epoxy resin used nor to epoxy resin in general. Applicant reiterates that the examples presented are only examples: numerous other materials can be used with a wide range of characteristics, components, and methods of production.

Two examples of an application of the composite are presented below, that of a ion implantation device source insulator, and a high voltage insulating X-ray box, though the invention is not so limited.

It can also be seen that for applications requiring high shielding ability (such as X-ray source shielding in the medical field) the invention may be formulated to provide a shielding ability sufficient for lead replacement.

Without undue experimentation higher density formulations may be produced on demand by mixing additional secondary fillers into the composition. While use of lead would under some circumstances be self-defeating, lead, tungsten, platinum, gold, iridium, silver, tantalum, and similar materials may be used. Alternatively, the barium sulfate volumetric percentage may be increased by use of injection molding, compression molding or transfer molding as permitted by materials handling techniques. As demonstrated by the example using hydrated alumina, other properties such as electrical resistivity/conductivity, workability, ductility, density, and so on may also be adjusted by use of secondary fillers, binders, and other agents in the composition.

Thus, it is apparent that a wide variety of products may be produced, as the characteristics of the barium sulfate composite of the present invention may be tailored depending upon the desired end characteristics. In addition, the environmental contamination engendered by the product is of a lesser order of magnitude than that produced by products containing lead.

An exemplary list of embodiments which may advantageously be produced using the material of the present invention includes X-ray tube insulators, apertures, and enclosures; X-ray tube high-voltage insulators and enclosures; X-ray tube high voltage apertures; X-ray tube high voltage encapsulation devices; high voltage insulating radioactive shielding containers; and other medical X-ray and gamma ray housings. Industrially, an exemplary list of embodiments in which the composition of the invention may advantageously be incorporated include ion source insulators for ion implantation machinery and other devices for insulating, isolating, directing, or shielding any radiation producing device. As stated, these lists are exemplary only, and embodiments of the invention may be utilized within the art field of radiation shielding in a broad range of equivalent ways.

FIG. 1 is a perspective view of an embodiment of an ion source electrical insulator according to the present invention. Ion source insulator 2 is generally annular in shape so as to allow to pass therethrough an ion implantation beam such as those used in the creation of microchip wafers. Such a device may advantageously have a desirable combination of radiation shielding ability, electrical resistivity/conductivity, physical parameters and other characteristics as are allowed by use of the polymer-barium sulfate composite of the present invention.

In use, the device may be placed directly against the ion source and/or may be placed around the ion stream at later points, for example, after magnetic devices which may focus, re-direct or otherwise alter the ion beam, or in any other location in which radiation or electrical charges may need to be blocked. Vacuum sealing surfaces 10 may facilitate provision of a tight seal. Alignment pin 20, one of several possible, may be used to assure proper alignment, the number and arrangement of pins obviously allows proper alignment to be assured in as many degrees of freedom as must be restricted. Metallic inserts 30 allow attachment of the device to the overall structure of the ion implanter device, medical device, or other device to which it belongs. The inserts have internal threads (not shown) allowing easy bolting to the larger machine of which the invention will be a part or a retrofit. Such features may be produced by molding, inserts, machining, or other means suitable for use with polymer materials as are known in the art. One additional desirable quality is that these features may be created "on demand" as requested by end users of the item.

Surface convolutions 40 may be used to provide additional properties such as to increase surface distance/area in order to prevent electrical arcing, to locally increase shielding or insulation, fit with other components of the overall system and so on.

While the exemplary ion source insulator is quite simple, such devices may be complex, having a much greater depth, having a much greater thickness, having multiple grooves and ridges and so on, Items created using the composite of the present invention need not be annular nor even circular but may be any shape as required. The range of sizes in such insulators is quite broad: from 1 inch to 20 or more inches tall, diameters from 6 to 40 inches, wall thicknesses which might be from ½ inch thick up to 3 inches thick and weights anywhere from under I pound to over 500 pounds.

The material of the device may be a barium sulfate composite as discussed previously.

Figure 2:
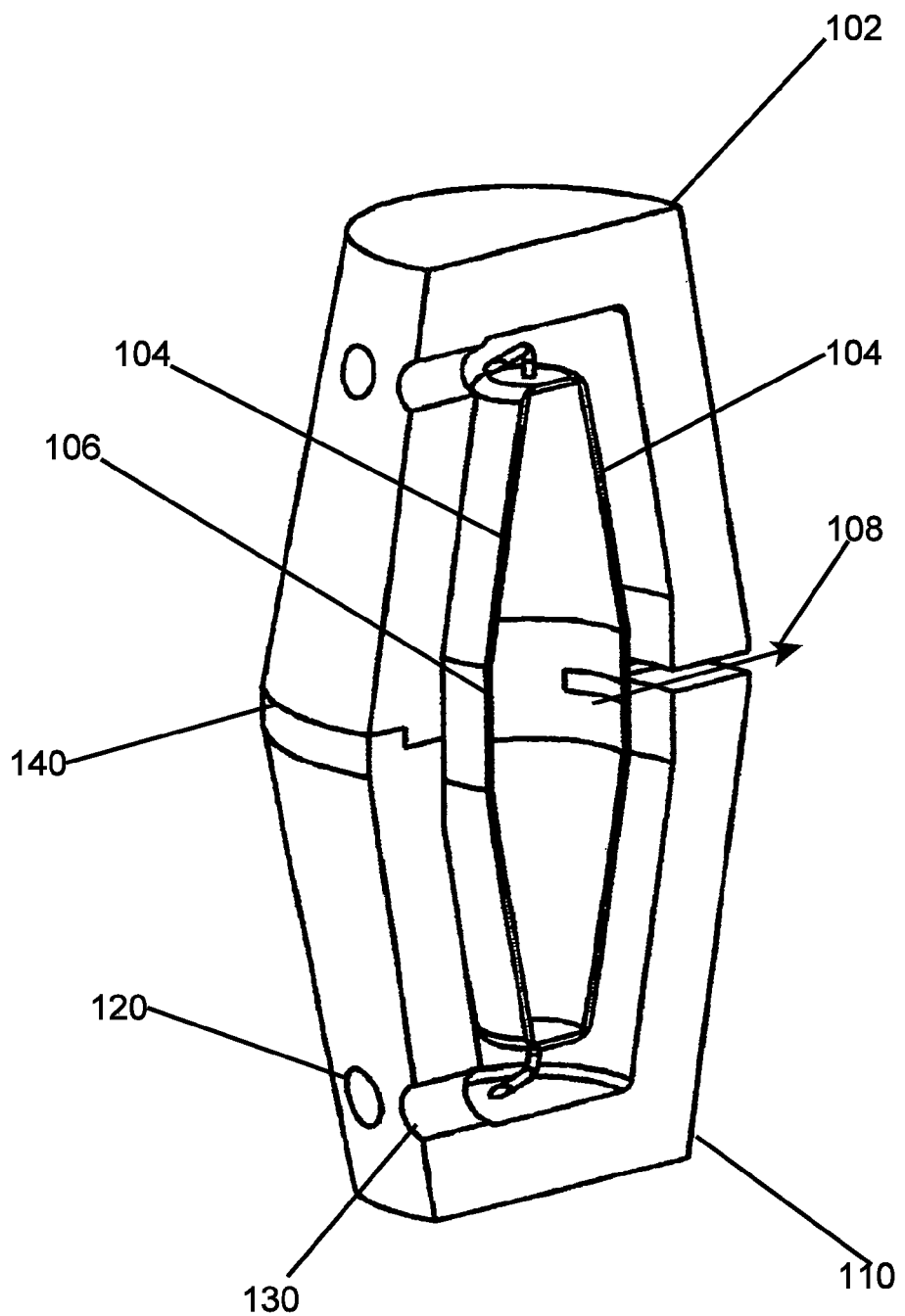
FIG. 2 is a cross-sectional perspective view of an X-ray box made with the material of the present invention.

As another example, FIG. 2 teaches one example of a high voltage insulating and X-ray shielding enclosure or box. X-ray shielding insulators are typically of an extremely wide range of shapes and sizes: cylinders, three dimensional conic sections, prisms, regular and irregular solids and composite shapes. A typical "box" might be irregular, 16 inches on a side and have a weight from 1 to 30 pounds. The thickness of the walls may be even greater than that of industrial-ion source insulators.

The enclosure 102 shown in cross-sectional perspective in FIG. 2 is a composite of two truncated conical sections, but is an example only. It contains X-ray tube 104, having plating 106 and emitting X-ray beam 108 by means of an emission port dimensioned and configured to allow the X-ray beam to pass therethrough.

Enclosure/box 102 has a number of features required to allow X-ray tube 104 to function properly. Enclosure 102 has thick walls 110 of the desired composite material: on a 3.5 to 1 replacement basis, the walls may be approximately 3.5 times as thick as a corresponding lead metal product, but at reduced cost. Alternatively, the desired composite material can be used with a 1:1 thickness as a replacement for a lead oxide filled component. Oil cooling port 120 and electrical port 130 allow oil and electrical connections to the interior of the box. Overlap joint 140 is designed to prevent radiation leakage from the joint during the case manufacture.

While the exemplary ion source insulator is quite simple, such devices may be complex, having a much greater depth, having a much greater thickness, having multiple grooves and ridges, and so on. Items created using the composite of the present invention need not be annular nor even circular but may be any shape as required. The range of sizes in such insulators is quite large: from 1 inch to 20 or more inches tall, diameters from 6 to 40 inches, wall thicknesses which might be from ½ inch thick up to 3 inches thick, and weights anywhere from under 1 pound to over 500 pounds.

High voltage insulating X-ray shielding enclosures are typically of an even wider range of shapes and sizes, cylinders, three dimensional conic sections, prisms, regular and irregular solids and composite shapes. A typical "box" might be irregular, 16 inches on a side, and have a weight from 1 to 30 pounds. The thickness of the walls may be even greater than that of industrial ion source insulators.

In short, regardless of shape or size of the item to be made the present invention may be adapted to any radioactive/ion/gamma ray/x-ray shielding application without undue experimentation and without departing from the scope of the invention. Formulations other than those specifically provided may be employed without departing from the scope of the invention.

The method of the invention, a process for producing a high voltage insulator having radiation shielding properties, may have the following steps:
- a) mixing uncured liquid epoxy polymers with desired percentages of powdered barium sulfate, other high density fillers, and/or powdered hydrated alumina;
- b) blending the mixture in high shear single blade vacuum mixers for a first predetermined time;
- c) pouring, injecting or vacuum casting the material in a mold having a generally annular body cavity having a diameter of at least 6 inches, the body cavity having at least one vacuum sealing surface;
- d) placing the material into an autoclave; and
- e) curing the mold and material therein at a temperature in a range from at least 70 degrees F. to 400 degrees F. for a period depending upon the size, configuration and exact choice of materials, the time ranging from at least two hours to 24 hours, at a pressure ranging from at least 50 to 250 psi.

This is in contrast to methods of creating thin and flexible radiation barriers, which do not involve casting.

This disclosure is provided to allow practice of the invention by those skilled in the art without undue experimentation, including the best mode presently contemplated and the presently preferred embodiment. Nothing in this disclosure is to be taken to limit the scope of the invention, which is susceptible to numerous alterations, equivalents and substitutions without departing from the scope and spirit of the invention. The scope of the invention is to be understood from the appended claims.

What is claimed is:

1. An electrical insulator for an ion source, the insulator comprising:
   a generally annular body having a diameter of at least 6 inches; the body having at least one vacuum sealing surface dimensioned and configured to provide a tight seal;
   the body made of a material comprising:
   a. a polymer matrix; and
   b. barium sulfate within the polymer matrix in an approximate amount between about 15% by volume and about 35% by volume.

2. The electrical insulator of claim 1, wherein the body is made of a material comprising at least about 20% by volume barium sulfate.

3. The electrical insulator of claim 1, wherein the body is made of a material comprising at least about 25% by volume barium sulfate.

4. The electrical insulator of claim 1, further comprising at least one element selected from alignment pins projecting from the vacuum sealing surface of the insulator, metal inserts secured to the body, and combinations thereof.

5. The electrical insulator of claim 1 further comprising a third material selected from the group consisting of electrically insulating materials, binders, high density materials, and combinations thereof.

6. The electrical insulator of claim 5, wherein the third material comprises at least one member selected from the group of bismuth, tungsten, lead, platinum, gold, silver, tantalum, calcium carbonate, hydrated alumina, tabular alumina, silica, glass beads, glass fibers, magnesium oxide/sulfate, wollastonite, stainless steel fibers, copper, carbonyl iron, iron, molybdenum, nickel and combinations thereof.

7. The electrical insulator of claim 1, wherein the polymer matrix comprises at least one member selected from the following group: epoxy, polyester, polyurethane, silicone rubber, bismaleimides, polyimides, vinylesters, urethane hybrids, polyurea elastomer, phenolics, cyanates, cellulose, flouro-polymer, ethylene inter-polymer alloy elastomer, ethylene vinyl acetate, nylon, polyetherimide, polyester elastomer, polyester sulfone, polyphenyl amide, polypropylene, polyvinylidene flouride, acrylic, homopolymers, acetates, copolymers, acrylonitrile-butadiene-styrene, flouropolymers, ionimers, polyamides, polyamide-imides, polyacrylates, polyether ketones, polyaryl-sulfones, polybenzimidazoles, polycarbonates, polybutylene, terephthalates, polyether sulfones, thermoplastic polyimides, thermoplastic polyurethanes, polyphenylene sulfides, polyethylene, polypropylene, polysulfones, polyvinylchlorides, styrene acrylonitriles, polystyrenes, polyphenylene, ether blends, styrene maleic anhydrides, allyls, aminos, polyphenylene oxide, and combinations thereof.

8. The electrical insulator of claim 1, wherein the polymer matrix comprises epoxy resin in an approximate amount of 50% to 70% by volume.

\* \* \* \* \*